US012665567B2

(12) United States Patent
Weng

(10) Patent No.: US 12,665,567 B2
(45) Date of Patent: Jun. 23, 2026

(54) BULK ACOUSTIC WAVE RESONATOR WITH METAL BONDING LAYER

(71) Applicant: Shenzhen Newsonic Technologies Co., Ltd., Shenzhen (CN)

(72) Inventor: Guojun Weng, Shenzhen (CN)

(73) Assignee: Shenzhen Newsonic Technologies Co., Ltd., Shenzhen (CN)

(*) Notice: Subject to any disclaimer, the term of this patent is extended or adjusted under 35 U.S.C. 154(b) by 883 days.

(21) Appl. No.: 18/058,417

(22) Filed: Nov. 23, 2022

(65) Prior Publication Data

US 2023/0084598 A1    Mar. 16, 2023

(51) Int. Cl.
*H03H 9/17* (2006.01)
*H03H 9/02* (2006.01)
*H03H 9/13* (2006.01)

(52) U.S. Cl.
CPC ........ *H03H 9/173* (2013.01); *H03H 9/02031* (2013.01); *H03H 9/13* (2013.01)

(58) Field of Classification Search
CPC ...... H03H 9/173; H03H 9/02031; H03H 9/13; H03H 9/171; H03H 9/02015; H03H 9/02102; H03H 9/131
See application file for complete search history.

(56) References Cited

U.S. PATENT DOCUMENTS

2012/0049976 A1    3/2012  Son et al.
2022/0131527 A1*   4/2022  Wang ..................... H03H 9/173

FOREIGN PATENT DOCUMENTS

CN          114553163 A      5/2022

OTHER PUBLICATIONS

International Search Report and Written Opinion for corresponding International Application No. PCT/IB2023/061700 dated Feb. 27, 2024.

* cited by examiner

*Primary Examiner* — Emily P Pham
(74) *Attorney, Agent, or Firm* — Finnegan, Henderson, Farabow, Garrett & Dunner LLP

(57) ABSTRACT

A bulk acoustic wave (BAW) resonator includes: a substrate; a piezoelectric layer disposed above the substrate; a first electrode disposed below the piezoelectric layer; a second electrode disposed above the piezoelectric layer; a first dielectric layer disposed below the piezoelectric layer; a second dielectric layer disposed below the first dielectric layer; a cavity disposed below the first electrode; a first grounded through hole disposed in the first dielectric layer and the second dielectric layer and spaced away from the cavity; a metal bonding layer disposed between the second dielectric layer and the substrate; a second grounded through hole disposed in the piezoelectric layer and aligned with the first grounded through hole, and a ground pad metal layer disposed on the piezoelectric layer and in the second grounded through hole, and electrically connected to the metal bonding layer.

11 Claims, 22 Drawing Sheets

*S0*

3000

S1

3000

3100

*S2*

S10

*S14*

BULK ACOUSTIC WAVE RESONATOR WITH METAL BONDING LAYER

FIELD OF THE DISCLOSURE

The present disclosure relates to the field of semiconductor devices and, in particular, to a bulk acoustic wave (BAW) resonator with a metal bonding layer.

BACKGROUND

A bulk acoustic wave (BAW) resonator is a device including a thin film that is made of a piezoelectric material and disposed between two electrodes. The BAW resonator device is typically fabricated using semiconductor microprocessing technology.

A BAW filter may include two or more BAW resonators. It is desirable to fabricate BAW filters and/or BAW resonators with superior quality and performance.

SUMMARY

According to one aspect of the disclosure, a bulk acoustic wave (BAW) resonator includes a substrate, a piezoelectric layer disposed above the substrate, a first electrode disposed below the piezoelectric layer, a second electrode disposed above the piezoelectric layer, a first dielectric layer disposed below the piezoelectric layer, a second dielectric layer disposed below the first dielectric layer, a cavity disposed below the first electrode, a first grounded through hole disposed in the first dielectric layer and the second dielectric layer and spaced away from the cavity, a metal bonding layer disposed between the second dielectric layer and the substrate, with a portion of the metal bonding layer being disposed in the first grounded through hole, a second grounded through hole disposed in the piezoelectric layer and aligned with the first grounded through hole, and a ground pad metal layer disposed on the piezoelectric layer, with a portion of the ground pad metal layer being disposed in the second grounded through hole. The portion of the ground pad metal layer in the second grounded through hole is electrically connected to the portion of the metal bonding layer disposed in the first grounded through hole.

BRIEF DESCRIPTION OF THE DRAWINGS

The accompanying drawings, which are incorporated in and constitute a part of this application, illustrate disclosed embodiments and, together with the description, serve to explain the disclosed embodiments.

DETAILED DESCRIPTION

Figure 1A:
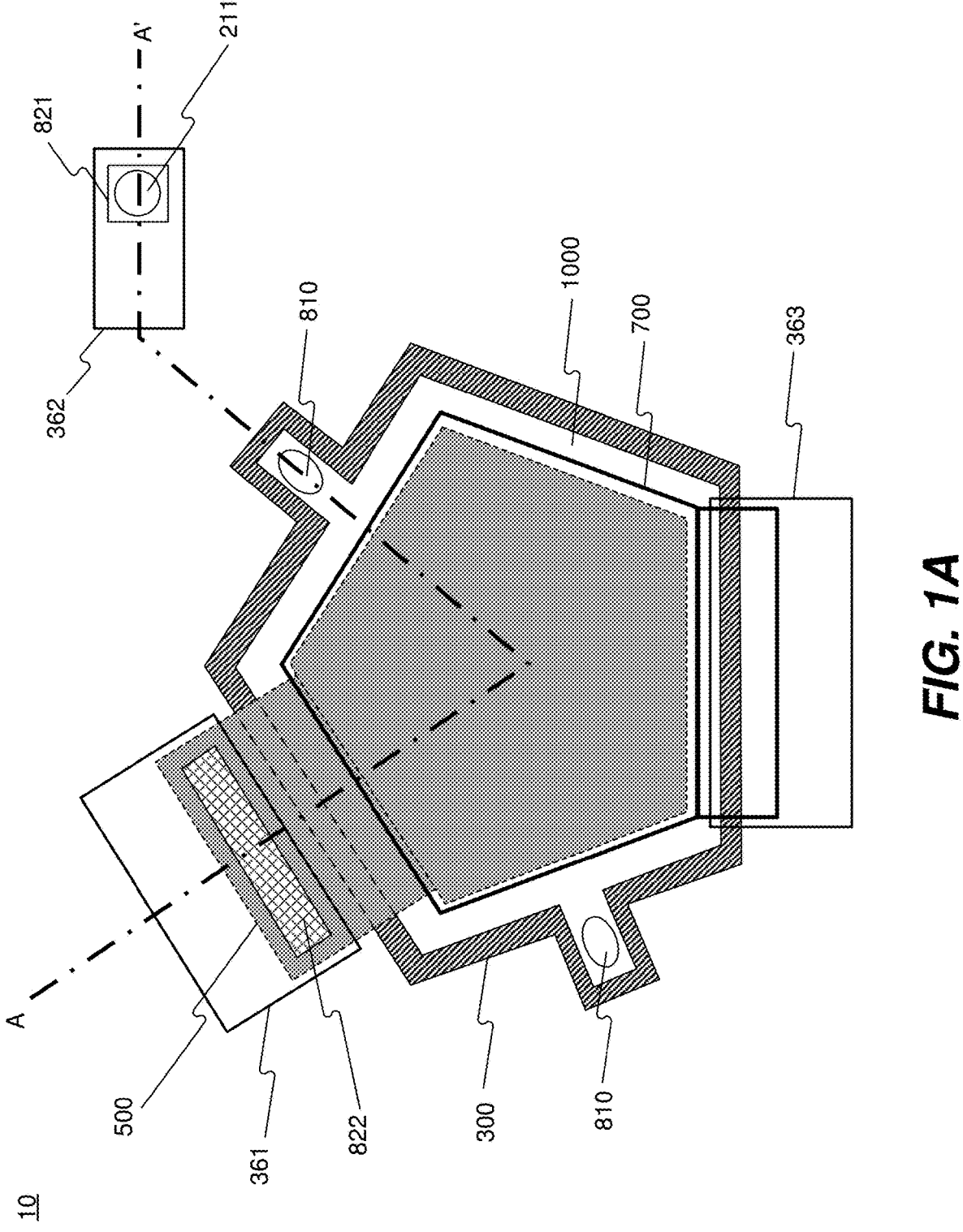
FIG. 1A is a top view showing selected portions of a BAW resonator to be used in a BAW filter, according to an embodiment of the present disclosure.

The text below provides a detailed description of the present disclosure in conjunction with specific embodiments illustrated in the attached drawings. However, these embodiments do not limit the present disclosure. The scope of protection for the present disclosure covers changes made to the structure, method, or function by persons having ordinary skill in the art on the basis of these embodiments.

To facilitate the presentation of the drawings in the present disclosure, the sizes of certain structures or portions may be enlarged relative to other structures or portions. Therefore, the drawings in the present disclosure are only for the purpose of illustrating the basic structure of the subject matter of the present disclosure. The same numbers in different drawings represent the same or similar elements unless otherwise represented.

Additionally, terms in the text indicating relative spatial position, such as "top," "bottom," "upper," "lower," "above," "below," and so forth, are used for explanatory purposes in describing the relationship between a unit or feature depicted in a drawing and another unit or feature therein. Terms indicating relative spatial position may refer to positions other than those depicted in the drawings when a device is being used or operated. For example, if a device shown in a drawing is flipped over, a unit which is described as being positioned "below" or "under" another unit or feature will be located "above" the other unit or feature. Therefore, the illustrative term "below" may include positions both above and below. A device may be oriented in other ways (e.g., rotated 90 degrees or facing another direction), and descriptive terms that appear in the text and are related to space should be interpreted accordingly. When a component or layer is said to be "above" another member or layer or "connected to" another member or layer, it may be directly above the other member or layer or directly connected to the other member or layer, or there may be an intermediate component or layer.

Conventionally, film bulk acoustic resonator (FBAR) and bulk acoustic wave (BAW) structures are manufactured based on bonding processes, most of which are based on $SiO_2$—Si or Si—Si bonding. The $SiO_2$—Si or Si—Si bonding usually has strict requirements on the material, roughness, and warpage of the wafer bonding surface, and the bonding process is difficult and the bonding quality control is not easy. On the other hand, metal bonding by eutectic bonding or metal diffusion bonding does not have strict requirements on bonding conditions, is relatively easy to carry out, and has good bonding quality. However, if a metal bonding layer is used in a BAW resonator, the presence of the metal bonding layer under a cavity of the resonator may negatively influence the performance of the resonator.

In embodiments of the present disclosure, to reduce or eliminate the influence of the metal bonding layer, the metal bonding layer may be grounded. The existence of the metal bonding layer also helps with heat dissipation of a FBAR filter and/or BAW resonator during operation, which is beneficial to the radio frequency power withstand capability of the FBAR filter.

Figure 1B:
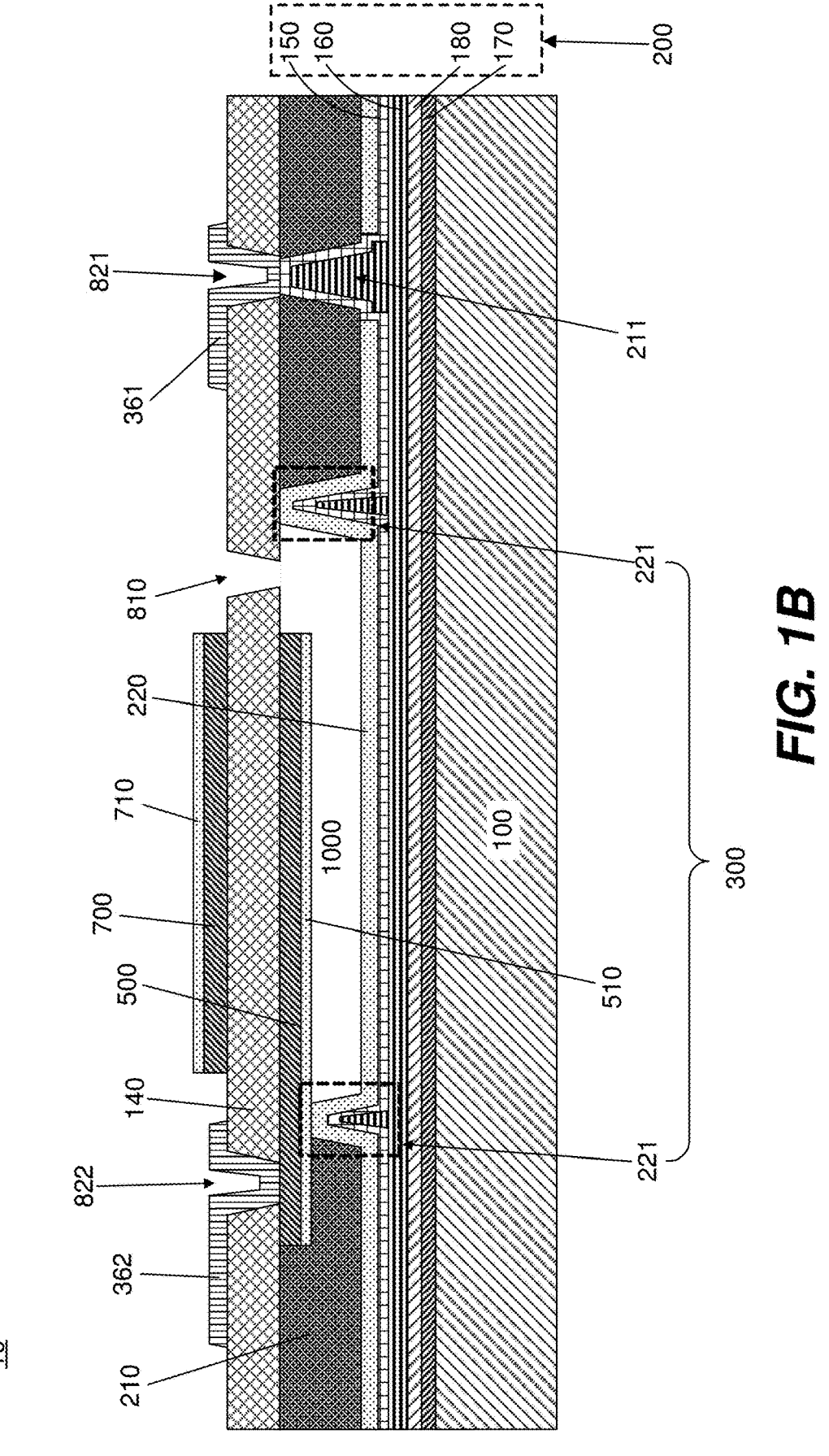
FIG. 1B is a cross-sectional view of the BAW resonator of FIG. 1A, along cross-sectional line A-A' shown in FIG. 1A.

FIG. 1A is a top view showing selected portions of a BAW resonator 10 to be used in a BAW filter, according to an embodiment of the present disclosure. FIG. 1B is a cross-sectional view of the BAW resonator 10 of FIG. 1A, along cross-sectional line A-A' shown in FIG. 1A.

As illustrated in FIGS. 1A and 1B, BAW resonator 10 includes a resonator substrate 100, a piezoelectric layer 140 disposed above resonator substrate 100, a first electrode 500 disposed below piezoelectric layer 140, a second electrode 700 disposed above piezoelectric layer 140, a first dielectric layer 210 disposed below piezoelectric layer 140, a second dielectric layer 220 disposed below first dielectric layer 210, a cavity 1000 disposed below first electrode 500, and a metal bonding layer 200 disposed between second dielectric layer 220 and resonator substrate 100, and including a first adhesive layer 150, a first bonding layer 160, a second adhesive layer 170, and a second bonding layer 180. A first grounded through hole 211 is disposed in first dielectric layer 210 and second dielectric layer 220, and is spaced away from cavity 1000. A portion of first adhesive layer 150 and a portion of first bonding layer 160 are disposed in first grounded through hole 211. A second grounded through hole 821 is disposed in piezoelectric layer 140 and aligned with first grounded through hole 211. A ground pad metal layer 361 is disposed on piezoelectric layer 140. A portion of ground pad metal layer 361 is disposed in second grounded through hole 821, and electrically connected to the portion of the first adhesive layer 150 disposed in first grounded through hole 211.

In BAW resonator 10 illustrated in FIGS. 1A and 1B, metal bonding layer 200 is electrically connected to ground pad metal layer 361. During operation of BAW resonator 10, ground pad metal layer 361 is grounded, and thus metal bonding layer 200 is grounded.

First dielectric layer 210 may be formed of silicon oxide. First dielectric layer 210 covers a portion of first electrode 500, and a portion of piezoelectric layer 140. The portions of first electrode 500 and piezoelectric layer 140 not covered by first dielectric layer 210 correspond to cavity 1000 of BAW resonator 10, which is formed by removing a portion of first dielectric layer 210 (referred to as a "sacrificial island") enclosed by double-wall protruding structure 221 of second dielectric layer 220.

Second dielectric layer 220 is disposed between metal bonding layer 200 and first dielectric layer 210, covers all surfaces of first dielectric layer 210 except for first grounded through hole 211. Second dielectric layer 220 may be formed of a non-conductive material that is not corroded by hydrofluoric acid, for example, polysilicon, amorphous silicon, aluminum nitride (AlN), silicon nitride (SiN), tantalum nitride (TaN), gallium nitride (GaN), or a stacked combination of two or more of those materials. Second dielectric layer 220 includes a double-wall protruding structure 221 protruding through first dielectric layer 210 toward piezoelectric layer 140 and surrounding cavity 1000. Double-wall protruding structure 221 constitutes a double-wall boundary structure 300 surrounding cavity 1000, which is a working area of BAW resonator 10 in which first electrode 500 and second electrode 700 partially overlap. Double-wall protruding structure 221 contacts a portion of piezoelectric layer 140 and a portion of first electrode 500. First adhesive layer 150 covers the sidewalls and a bottom of double-wall protruding structure 221. First bonding layer 160 fills in double-wall protruding structure 221.

First grounded through hole 211 is formed by etching first dielectric layer 210 and second dielectric layer 220. Piezoelectric layer 140 is exposed at the bottom of first grounded through hole 211, and there is no second dielectric layer 220 in first grounded through hole 211. The sidewalls and the bottom of first grounded through hole 211 are covered by first adhesive layer 150 of metal bonding layer 200. First grounded through hole 211 is filled by first bonding layer 160.

First adhesive layer 150 and second adhesive layer 170 may be formed of one of chromium (Cr), titanium (Ti), titanium nitride (TiN), titanium tungsten (TiW), tantalum (Ta), tantalum nitride (TaN), or a stacked combination of two or more of those materials. First bonding layer 160 and second bonding layer 180 may be formed of one of gold (Au), copper (Cu), aluminum (Al), indium (In), nickel (Ni), tin (Sn), or a stacked combination of two or more of those materials.

First adhesive layer 150 covers a surface of second dielectric layer 220, and the sidewalls and a bottom of first grounded through hole 211. First bonding layer 160 overlays first adhesive layer 150 and fills in first grounded through hole 211. Second adhesive layer 170 is disposed on a surface of resonator substrate 100 facing piezoelectric layer 140. Second bonding layer 180 is disposed on second adhesive layer 170 and bonds to first bonding layer 160 by eutectic bonding or metal diffusion bonding.

A contact hole 822 is formed in piezoelectric layer 140, and exposes a portion of first electrode 500. A first electrode pad metal layer 362 is disposed on piezoelectric layer 140 and in contact hole 822, and contacts and electrically connects to first electrode 500. A second electrode pad metal layer 363 (shown in FIG. 1A) is disposed on piezoelectric layer 140 and contacts and electrically connects to a portion of second electrode 700.

Resonator substrate 100 may be formed of silicon, glass (silicon oxide), sapphire ($Al_2O_3$), gallium nitride (GaN), silicon carbide (SiC), aluminum nitride (AlN), etc. Piezoelectric layer 140 may be formed of AlN or ScAlN. Piezoelectric layer 140 includes one or more release holes 810 that expose cavity 1000. One or more release holes are formed in piezoelectric layer 140, and expose cavity 1000.

A first passivation layer 510 is disposed below first electrode 500. A second passivation layer 710 is disposed above second electrode 700.

Figure 2:
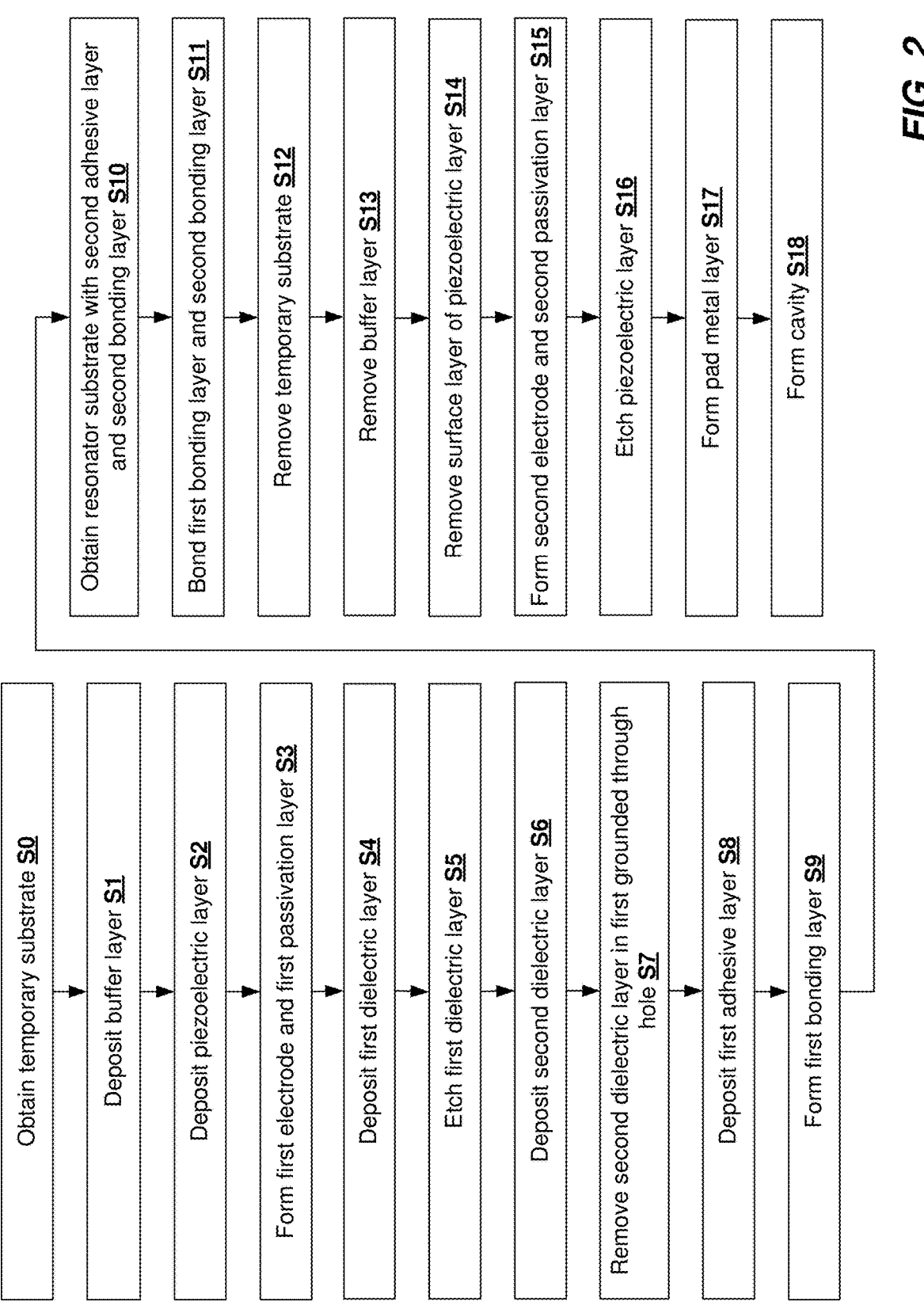
FIG. 2 is a flow chart of a process of fabricating the BAW resonator of FIGS. 1A and 1B, according to an embodiment of the present disclosure.
Figure 3A:
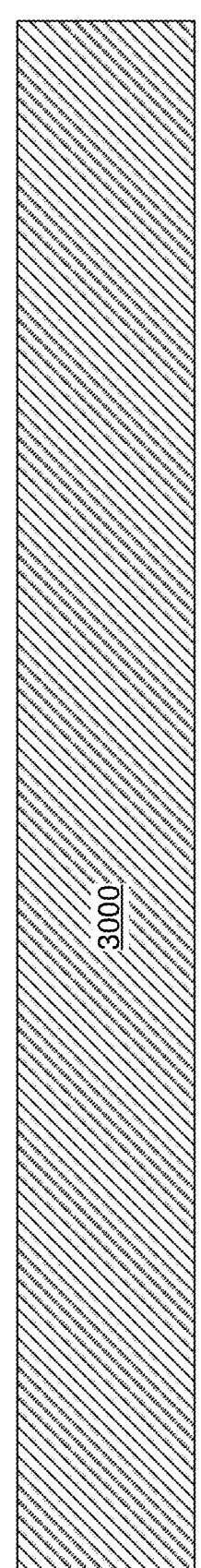
FIGS. 3A-3S are cross-sectional views of structures formed in the process of FIG. 2, according to an embodiment of the present disclosure.

FIG. 2 is a flow chart of a process of fabricating BAW resonator 10, according to an embodiment of the present disclosure. FIGS. 3A-3S are cross-sectional views of structures formed in the process of FIG. 2, according to an embodiment of the present disclosure.

As illustrated in FIG. 3A, in step S0, a temporary substrate 3000 is obtained. Temporary substrate 3000 may be formed of silicon.

Figure 3B:
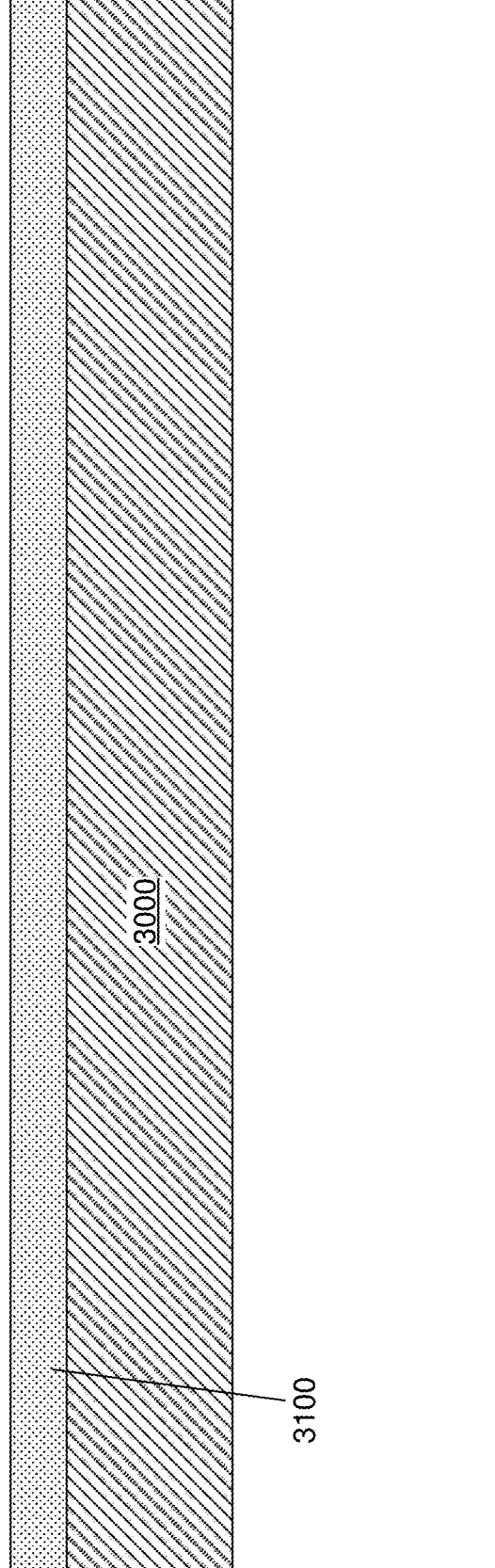

As illustrated in FIG. 3B, in step S1, a buffer layer 3100 is deposited on temporary substrate 3000. Buffer layer 3100 serves as an etch stop layer for removing temporary substrate 3000 in a subsequent process. Buffer layer 3100 also serves as a transition layer, which is beneficial to the quality of piezoelectric layer 140 which is subsequently grown on buffer layer 3100. Buffer layer 3100 may be formed of silicon oxide ($SiO_2$), silicon nitride (SiN), aluminum oxide ($Al_2O_3$), gallium nitride (GaN), aluminum nitride (AlN), or silicon carbide (SiC), or a stacked combination of two or more of those materials.

In one embodiment, an AlN layer is deposited on temporary substrate 3000 which is formed of silicon, and a GaN layer is deposited on the AlN layer. The stack of AlN layer and GaN layer is used as buffer layer 3100. In a subsequent process, an AlN or ScAlN piezoelectric layer is deposited on the surface of the GaN layer. Due to the good lattice matching between GaN and AlN/ScAlN, the crystal quality of the AlN or ScAlN piezoelectric layer is good.

In another embodiment, a silicon oxide layer is formed on the silicon temporary substrate 3000. The silicon oxide layer severs as buffer layer 3100, which also serves as an etch stop layer for subsequent removal of temporary substrate 3000. Then, a thin AlN seed layer ("first AlN layer") is deposited on the silicon oxide buffer layer 3100. The thin AlN seed layer is used to bond resonator substrate 100 in a subsequent process, and may be removed after removal of temporary substrate 3000. Therefore, the AlN seed layer may be formed thicker, which is beneficial to the quality of the piezoelectric crystal deposited thereon. Afterwards, an AlN layer ("second AlN layer") or a ScAlN piezoelectric layer is deposited on the AlN seed layer. The AlN seed layer may be removed after resonator substrate 100 is bonded and temporary substrate 3000 is removed.

In another embodiment, an AlN thin layer ("first AlN layer") is directly deposited on the silicon temporary substrate 3000 to serve as buffer layer 3100. The lattice quality of the AlN thin layer directly deposited on silicon temporary substrate 3000 is better than that of an AlN thin layer deposited on a silicon oxide layer. In addition, because the AlN thin layer may be removed in a subsequent process, the AlN thin layer may be formed thicker. After depositing the AlN thin layer, an AlN layer ("second AlN layer") or a ScAlN piezoelectric layer is deposited on the AlN thin layer. The AlN thin layer may be removed after resonator substrate 100 is bonded and temporary substrate 3000 is removed.

In another embodiment, when the piezoelectric layer is formed of pure AlN that is not doped with Sc, a silicon oxide layer may be deposited on temporary substrate 3000 to serve as buffer layer 3100. An AlN piezoelectric layer may be directly and continuously deposited on the silicon oxide layer at one time. After resonator substrate 100 is bonded and temporary substrate 3000 are removed, a lower portion of the AlN piezoelectric layer (the initially deposited part) may be removed to leave the remaining portion (an upper portion) of the AlN piezoelectric layer with good crystal quality as piezoelectric layer 140.

In still another embodiment, when the piezoelectric layer is formed of pure AlN that is not doped with Sc, an AlN piezoelectric layer can be directly and continuously deposited on temporary substrate 3000. The initially deposited part of the AlN piezoelectric layer serves as buffer layer 3100, which may be removed after resonator substrate 100 is bonded and temporary substrate 3000 is removed. The later deposited part of the AlN piezoelectric layer with good crystal quality serves as piezoelectric layer 140.

Figure 3C:
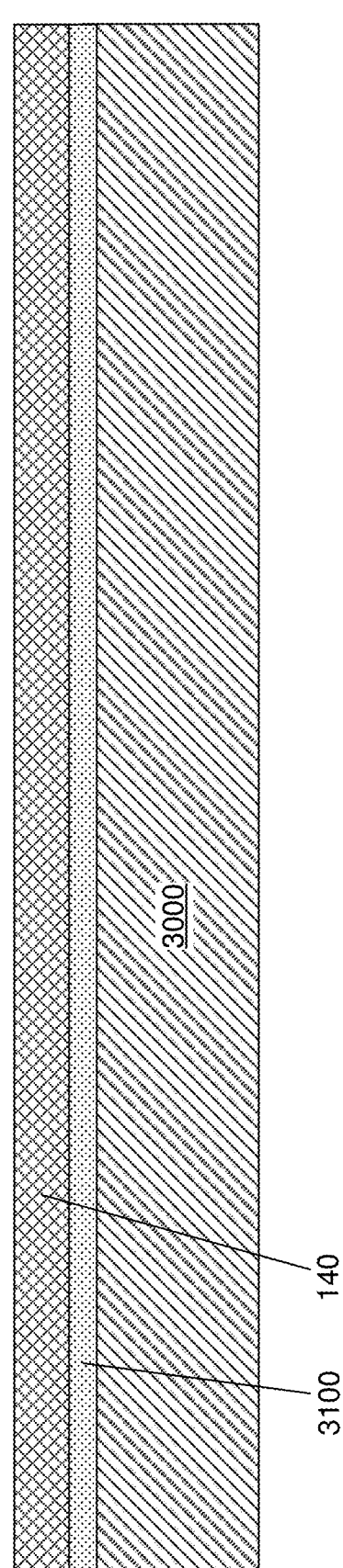

As illustrated in FIG. 3C, in step S2, piezoelectric layer 140 is deposited on buffer layer 3100. Piezoelectric layer 140 may be formed of AlN or scandium-doped aluminum nitride (ScAlN). The deposition thickness of piezoelectric layer 140 is greater than a target thickness of piezoelectric layer 140 in BAW resonator 10.

Figure 3D:
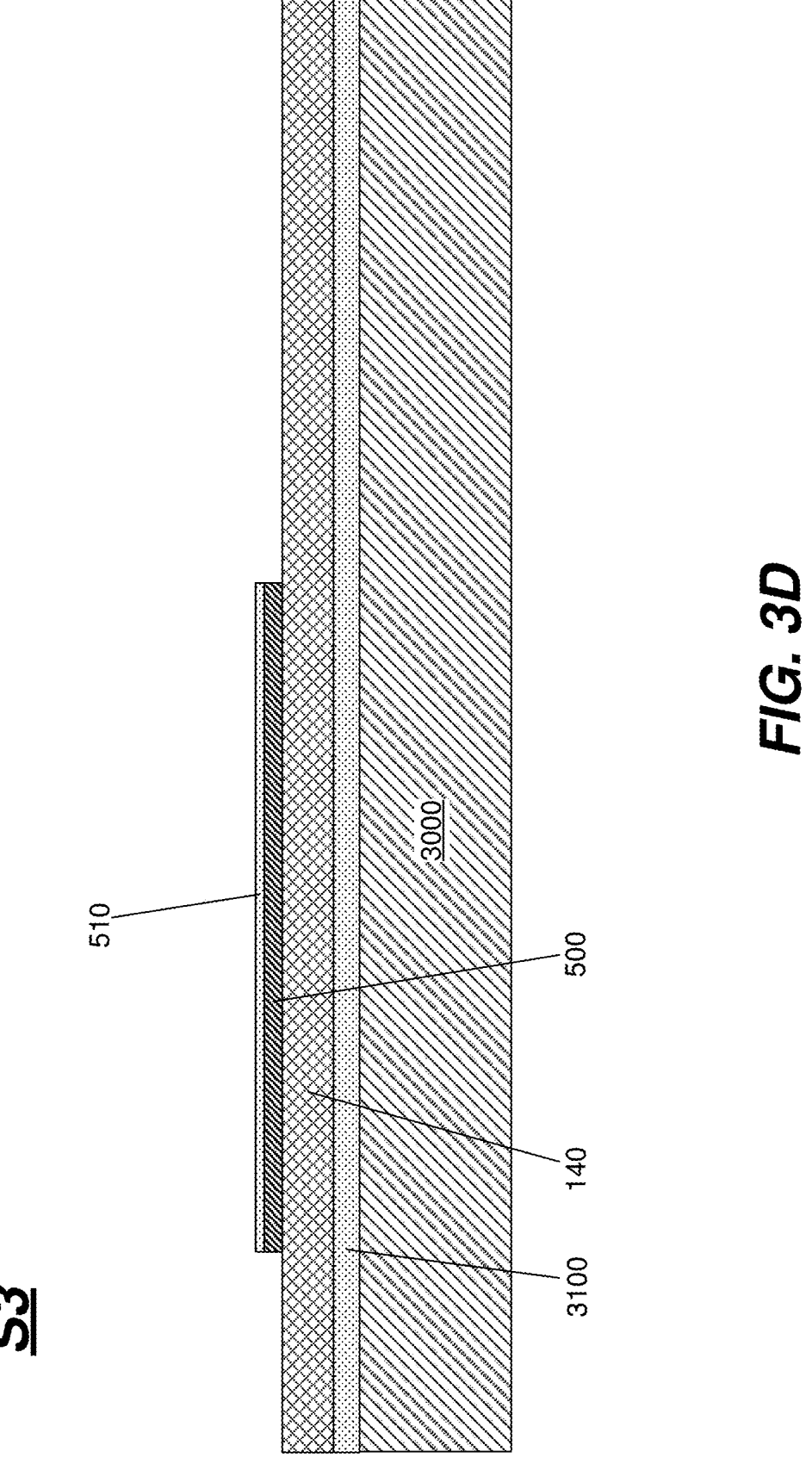

As illustrated in FIG. 3D, in step S3, a first electrode layer is formed on piezoelectric layer 140, and a passivation layer is formed on the first electrode layer. Then, the first electrode layer and the passivation layer formed thereon are patterned to form first electrode 500 and first passivation layer 510. First electrode 500 may be formed of a metal material.

Figure 3E:
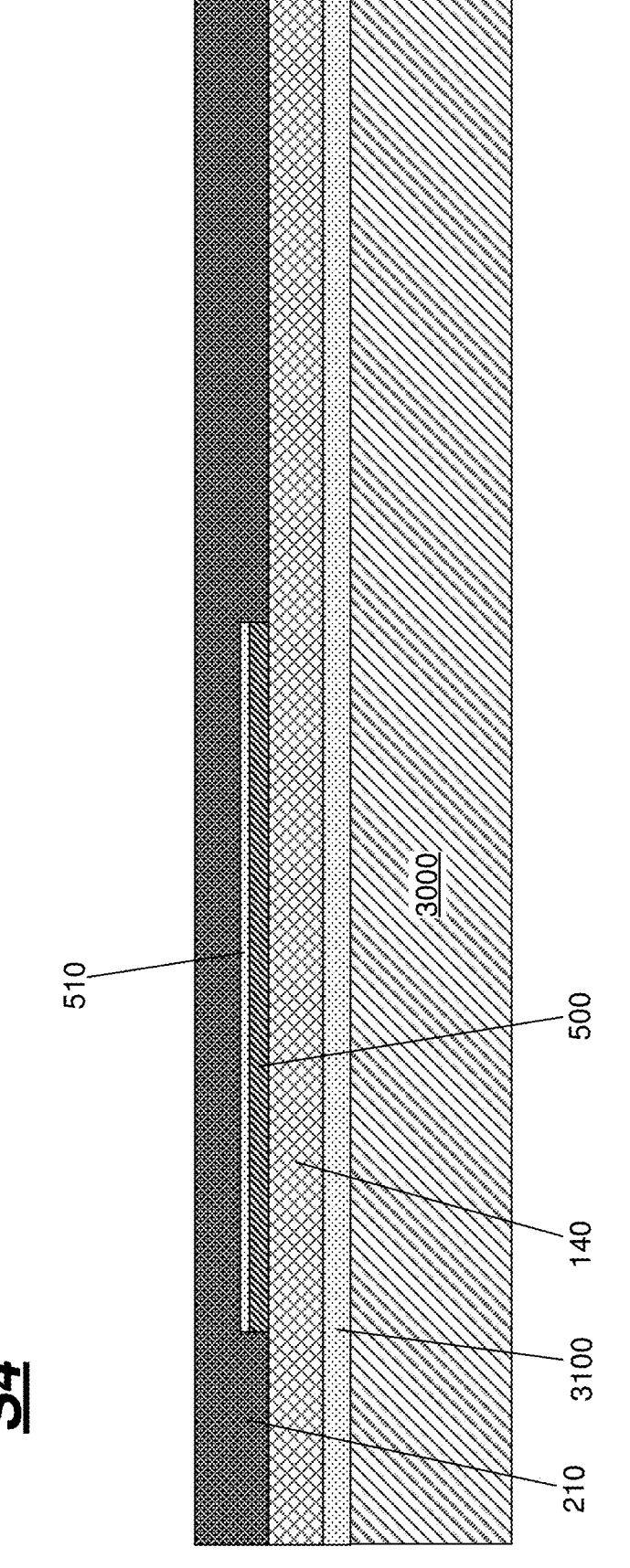

As illustrated in FIG. 3E, in step S4, first dielectric layer 210 is deposited on the structure of FIG. 3D. First dielectric layer 210 may be formed of silicon oxide. First dielectric layer 210 covers piezoelectric layer 140, first electrode 500, and first passivation layer 510.

Figure 3F:
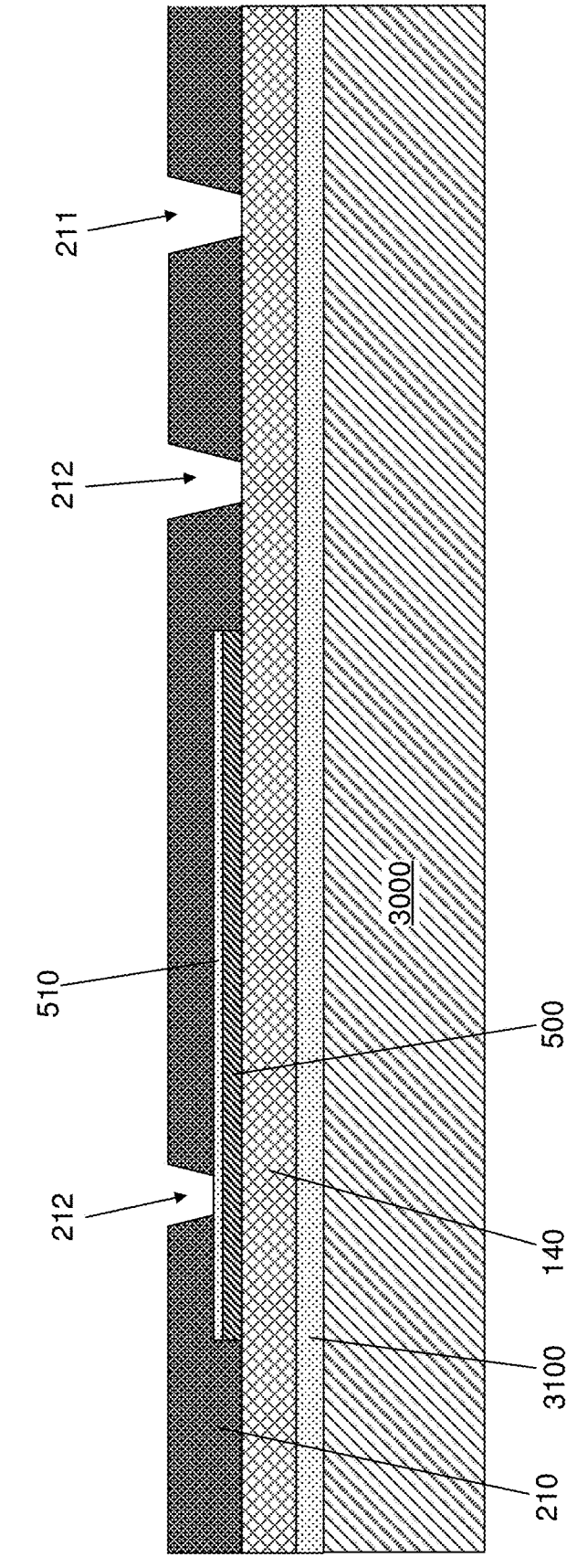

As illustrated in FIG. 3F, in step S5, first dielectric layer 210 is etched to form first grounded through hole 211, and a trench 212 surrounding the working area of BAW resonator 10. The portion of first dielectric layer 210 surrounded by trench 212 serves as a sacrificial layer that will be removed in a subsequent process to form cavity 1000. A portion of piezoelectric layer 140 and a portion of first passivation layer 510 are exposed at the bottom of trench 212. A portion of piezoelectric layer 140 is exposed at the bottom of first grounded through hole 211.

Figure 3G:
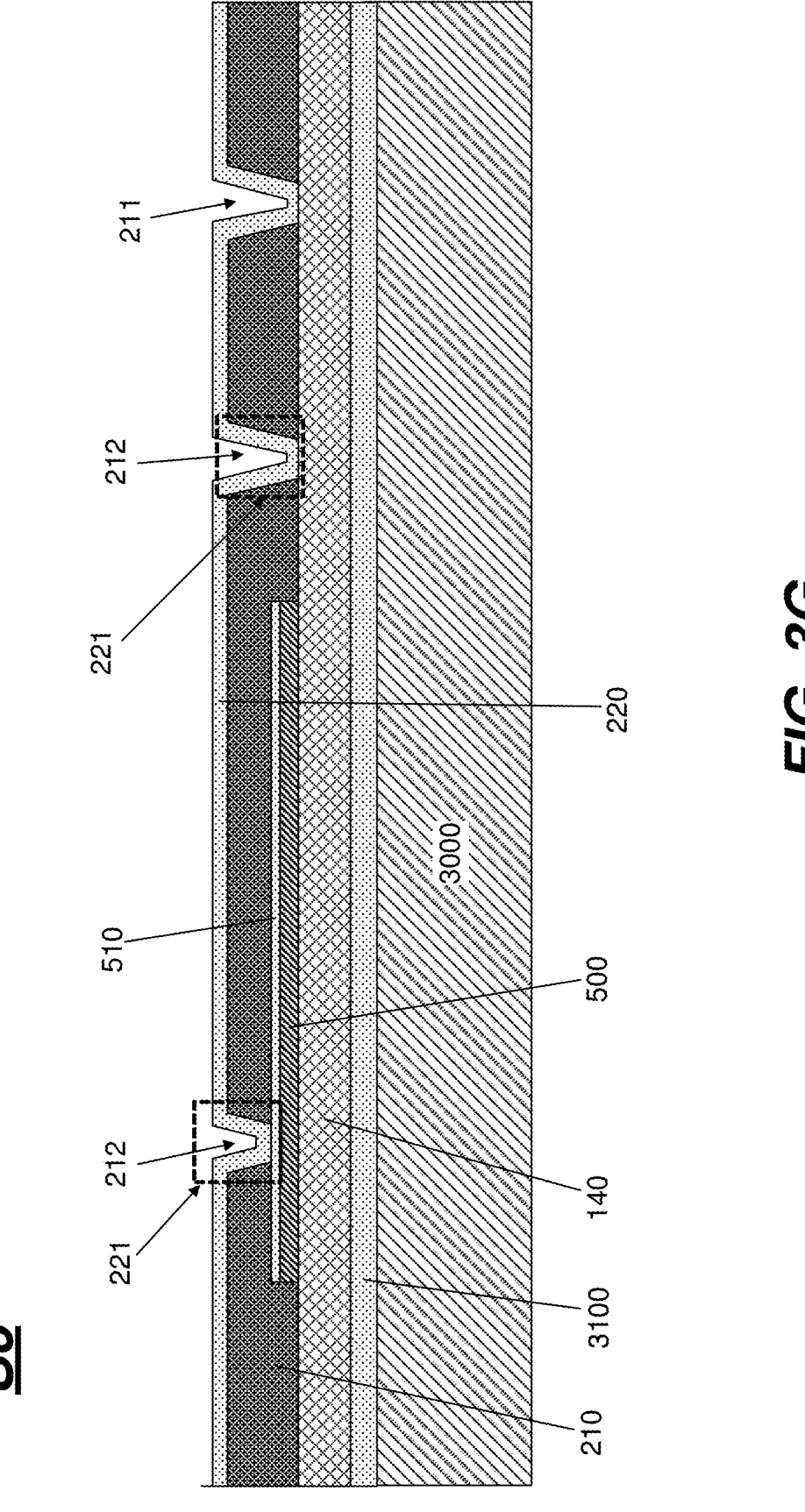

As illustrated in FIG. 3G, in step S6, second dielectric layer 220 is deposited on the surface of the structure of FIG. 3F. Second dielectric layer 220 may be formed of polysilicon, amorphous silicon, silicon nitride, aluminum nitride, gallium nitride, tantalum nitride, or a stacked combination of two or more of those materials. Second dielectric layer 220 completely covers the top surface of first dielectric layer 210, as well as the sidewalls and bottoms of first grounded through hole 211 and trench 212 formed in first dielectric layer 210. Second dielectric layer 220 also covers the portion of piezoelectric layer 140 exposed at the bottom of first grounded through hole 211, and the portions of piezoelectric layer 140 and first passivation layer 510 exposed at the bottom of trench 212. The portion of second dielectric layer 220 deposited on the sidewalls and the bottom of trench 212 constitutes double-wall protruding structure 221 that surrounds a portion of first dielectric layer 210 (referred to as "sacrificial island") which will be removed to form cavity 1000.

Figure 3H:
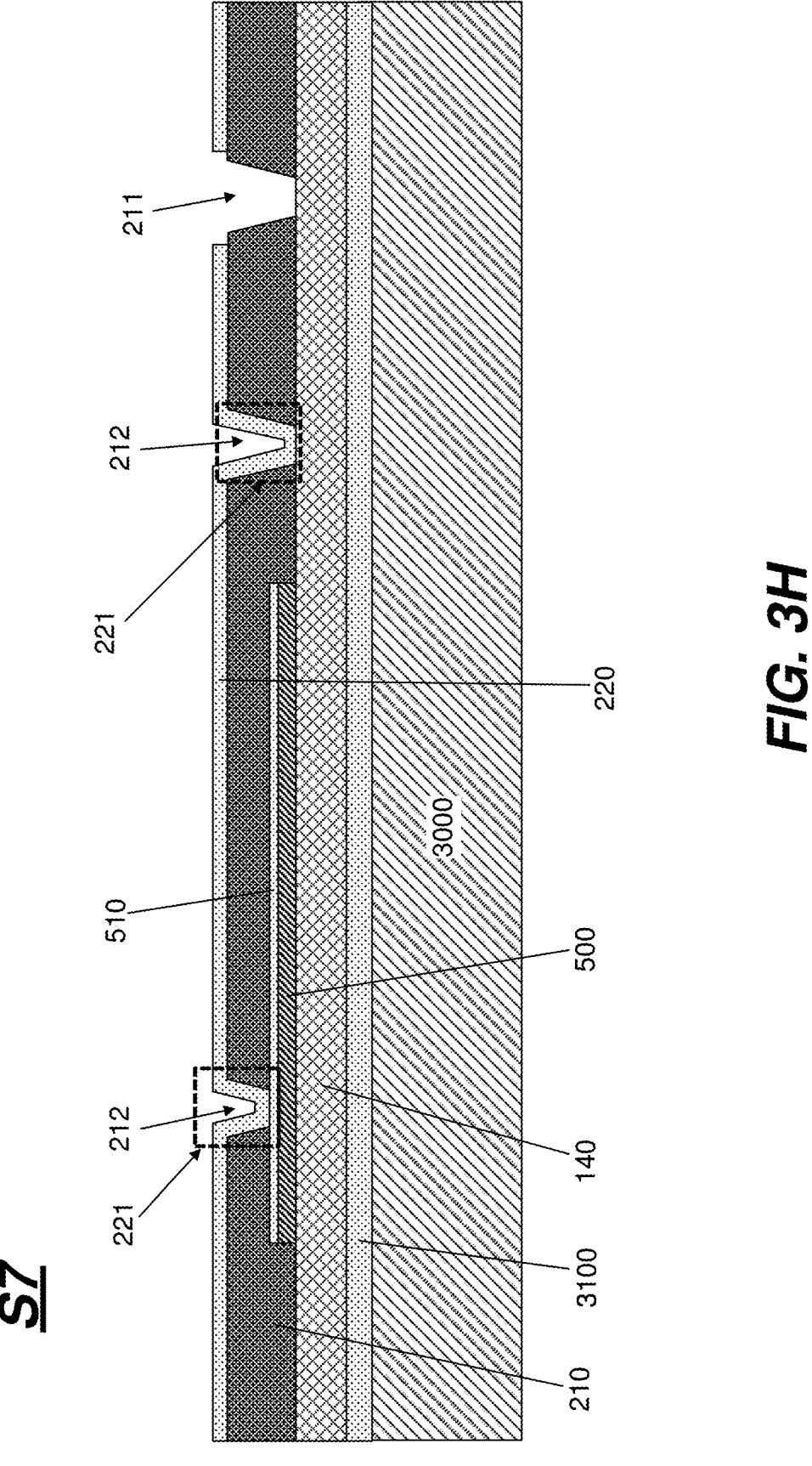

As illustrated in FIG. 3H, in step S7, the portion of second electrode layer 220 that covers the sidewalls and the bottom of first grounded through hole 211 is removed. As a result, the portion of piezoelectric layer 140 at the bottom of first grounded through hole 211 is exposed.

Figure 3I:
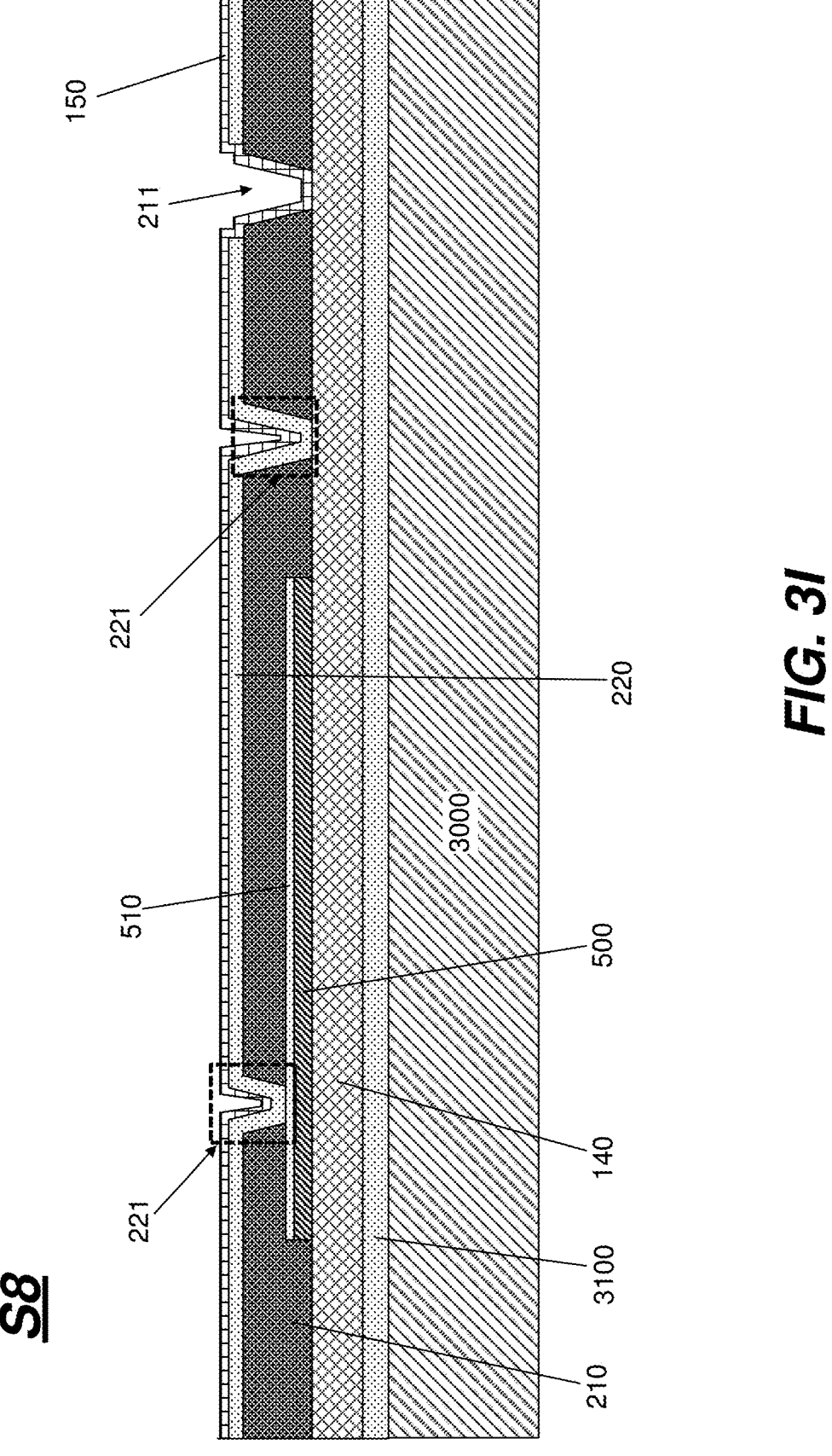

As illustrated in FIG. 3I, in step S8, first adhesive layer 150 is deposited on the surface of the structure of FIG. 3H. First adhesive layer 150 covers the entire surface of second dielectric layer 220 including the sidewalls and the bottom of double-wall protruding structure 221, the sidewalls of first grounded through hole 211, and the portion of piezoelectric layer 140 exposed at the bottom of first grounded through hole 211. First adhesive layer 150 may be formed of chromium (Cr), titanium (Ti), titanium nitride (TiN), titanium tungsten (TiW), tantalum (Ta), tantalum nitride (TaN), or other materials, or a stacked combination of two or more of those materials.

Figure 3J:
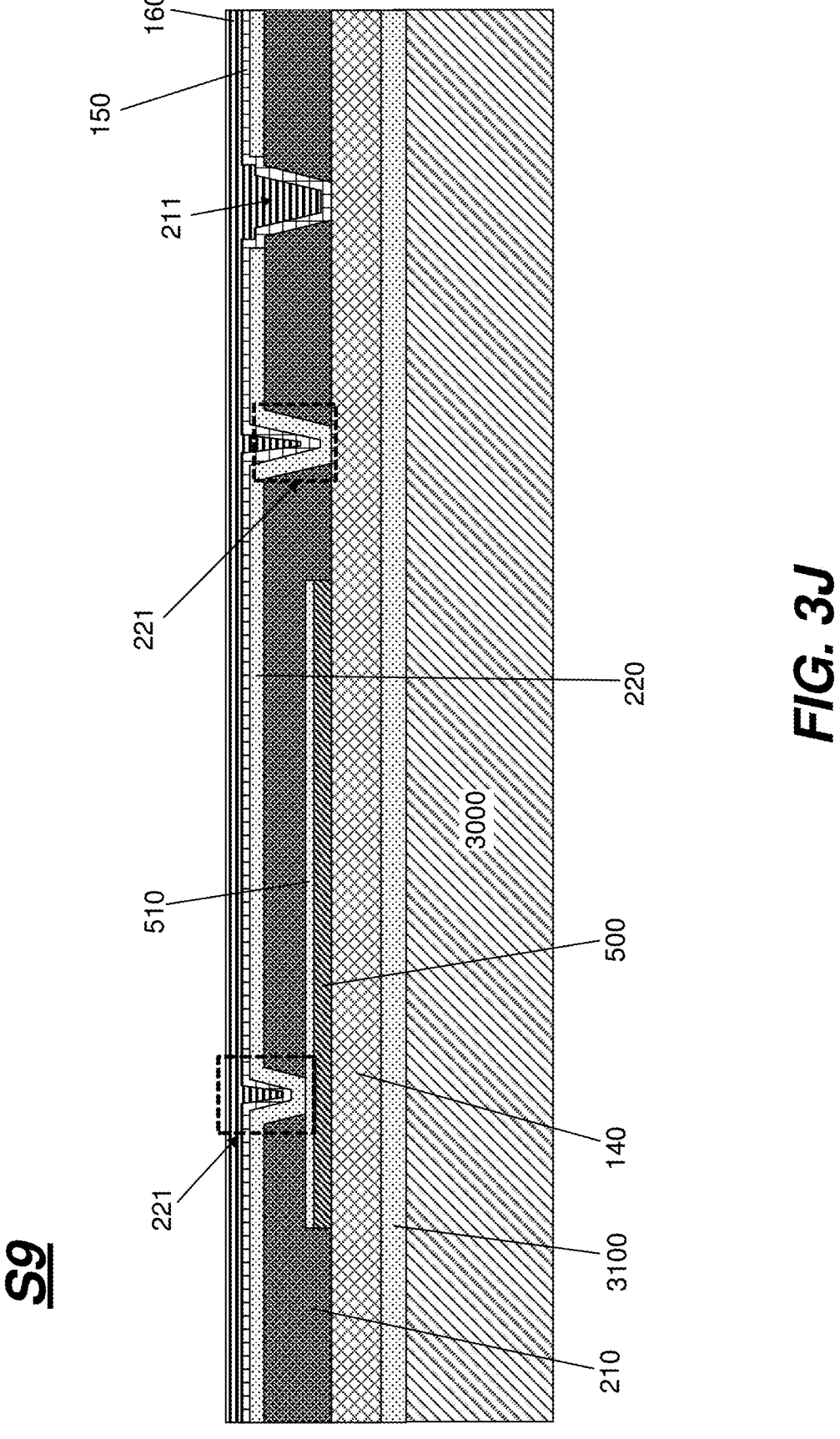

As illustrated in FIG. 3J, in step S9, first bonding layer 160 is electroplated on the structure of FIG. 3I. The electroplated first bonding layer 160 fills in double-wall protruding structure 221 of second dielectric layer 220 and first grounded through hole 211, and covers all surfaces of first adhesive layer 150. The top surface of first bonding layer 160 may be subjected to chemical mechanical polishing (CMP) planarization treatment if necessary. In a subsequent process, first bonding layer 160 and second bonding layer 180 (deposited on second adhesive layer 170 on the surface of resonator substrate 100) are bonded via eutectic bonding or metal diffusion bonding. The material of first bonding layer 160 and second bonding layer 180 may be a single metal material or a laminated stack of multiple metal materials suitable for the bonding process, such as Cu, Au, Al, In, Sn, or Ni. When first bonding layer 160 is a stacked combination of multiple metal layers, an electroplating process may be performed to form a first metal layer to fill double-wall protruding structure 221 of second dielectric layer 220 and first grounded through hole 211, and to cover the surfaces of second dielectric layer 220, and then an evaporation, chemical vapor deposition (CVD), or physical vapor deposition (PVD) process may be performed to form other metal layers on the first metal layer.

Figure 3K:
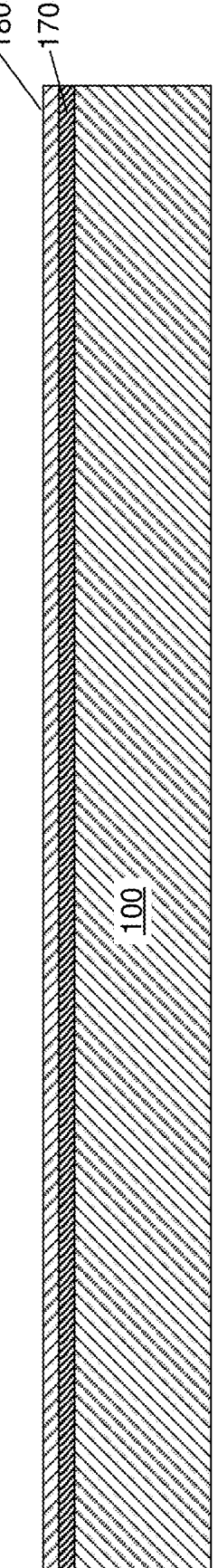

As illustrated in FIG. 3K, in step S10, resonator substrate 100 is obtained, and second adhesive layer 170 and second bonding layer 180 are sequentially deposited on resonator substrate 100. Both of second adhesive layer 170 and second bonding layer 180 are formed of metal materials. Resonator substrate 100 may be formed of silicon, glass (silicon oxide), sapphire (Al$_2$O$_3$), gallium nitride (GaN), silicon carbide (SiC), aluminum nitride (AlN). Second adhesive layer 170 adheres second bonding layer 180 to the surface of resonator substrate 100. Second adhesive layer 170 may be formed of chromium (Cr), titanium (Ti), titanium nitride (TiN), titanium tungsten (TiW), tantalum (Ta), tantalum nitride (TaN), or other materials, or a stacked combination of two or more of those materials. Second bonding layer 180 and first bonding layer 160 are bonded together via eutectic bonding or metal diffusion bonding. First bonding layer 160 and second bonding layer 180 may be formed of a single metal or a stack of multiple metal materials suitable for the bonding process.

In one embodiment, both of first bonding layer 160 and second bonding layer 180 are formed of gold (Au), copper (Cu), or aluminum (Al), and first bonding layer 160 and second bonding layer 180 are bonded together by metal diffusion bonding. In another embodiment, one of first bonding layer 160 and second bonding layer 180 is formed of a stack of gold (Au) and indium (In) (an indium layer covering a gold layer), and the other one of first bonding layer 160 and second bonding layer 180 is formed of gold (Au), and first bonding layer 160 and second bonding layer 180 are bonded together by Au—In eutectic alloy bonding. In another embodiment, one of first bonding layer 160 and second bonding layer 180 is formed of a stack of nickel (Ni), indium (In), and gold (Au), and the other one of first bonding layer 160 and second bonding layer 180 is formed of a stack of nickel (Ni) and gold (Au), and first bonding layer 160 and second bonding layer 180 are bonded together by Au—In eutectic alloy bonding. In another embodiment, one of first bonding layer 160 and second bonding layer 180 is formed of a stack of copper (Cu) and tin (Sn) (a tin layer covering a copper layer), and the other one of first bonding layer 160 and second bonding layer 180 is formed of copper (Cu), and first bonding layer 160 and second bonding layer 180 are bonded together by Cu—Sn eutectic alloy bonding. In another embodiment, one of first bonding layer 160 and second bonding layer 180 is formed of a stack of gold (Au) and tin (Sn) (a tin layer covering a gold layer), and the other one of first bonding layer 160 and second bonding layer 180 is formed of gold (Au), and first bonding layer 160 and second bonding layer 180 are bonded together by Au—Sn eutectic alloy bonding. In another embodiment, one of first bonding layer 160 and second bonding layer 180 is formed of a stack of nickel (Ni) and tin (Sn) (a tin layer covering a nickel layer), and the other one of first bonding layer 160 and second bonding layer 180 is formed of gold (Au), and first bonding layer 160 and second bonding layer 180 are bonded together by Au—Sn eutectic alloy bonding.

Figure 3L:
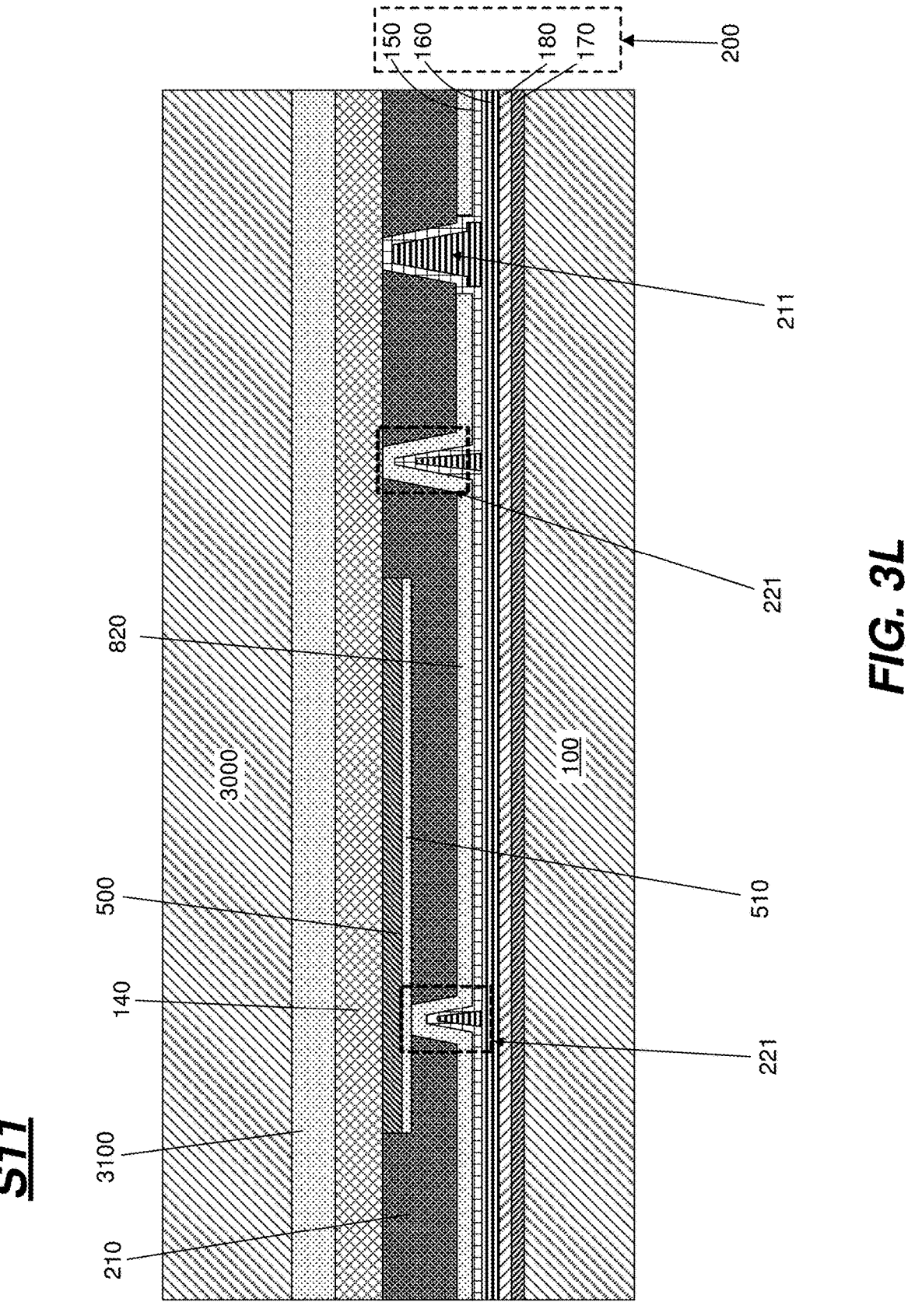

As illustrated in FIG. 3L, in step S11, first bonding layer 160 on the structure of FIG. 3J and second bonding layer 180 on the structure of FIG. 3K are bonded together. As a result, the structure of FIG. 3K is bonded with the structure of FIG. 3J. First adhesive layer 150, first bonding layer 160, second adhesive layer 170, and second bonding layer 180 together constitute metal bonding layer 200.

Figure 3M:
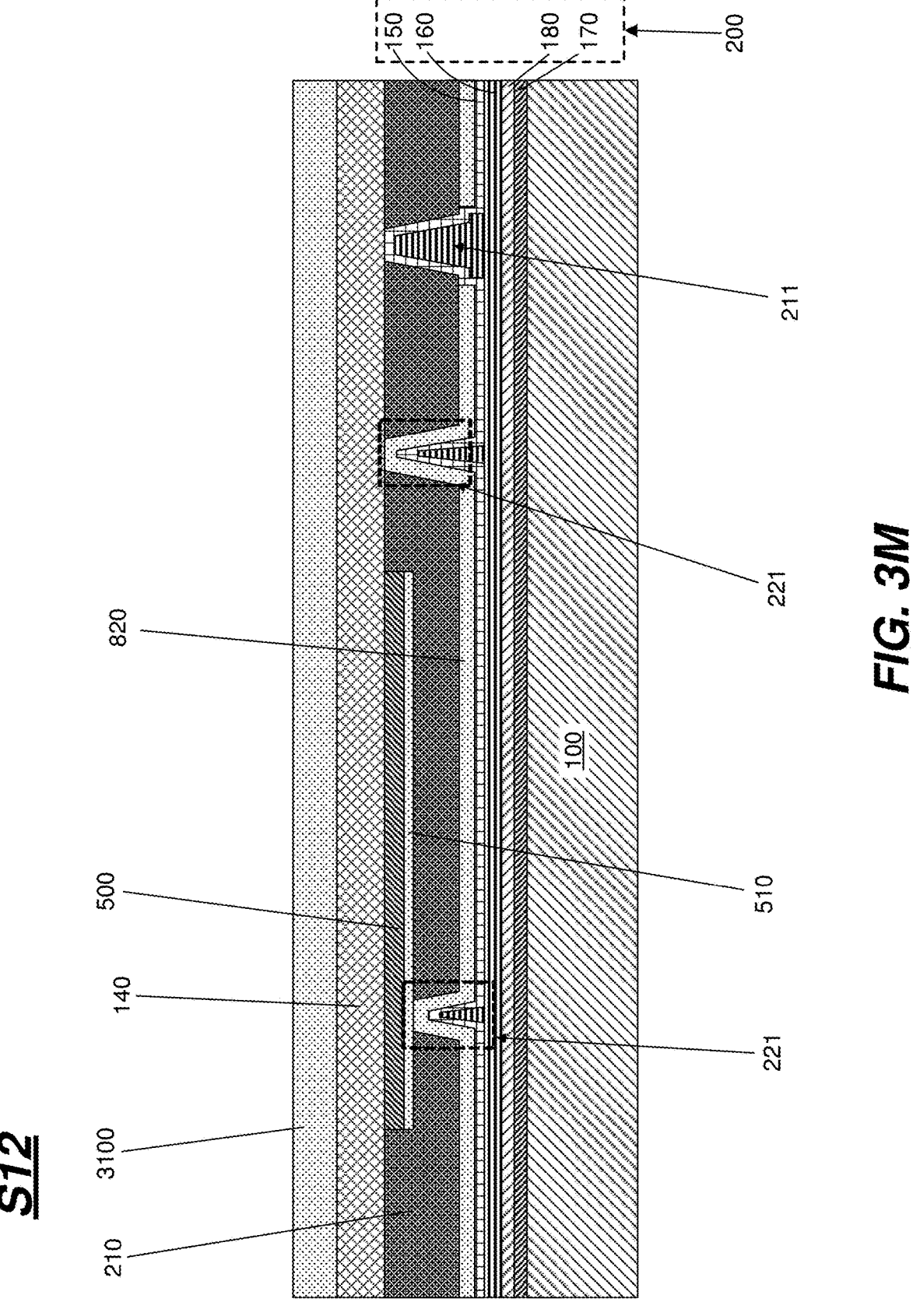

As illustrated in FIG. 3M, in step S12, temporary substrate 3000 is removed to expose buffer layer 3100.

Figure 3N:
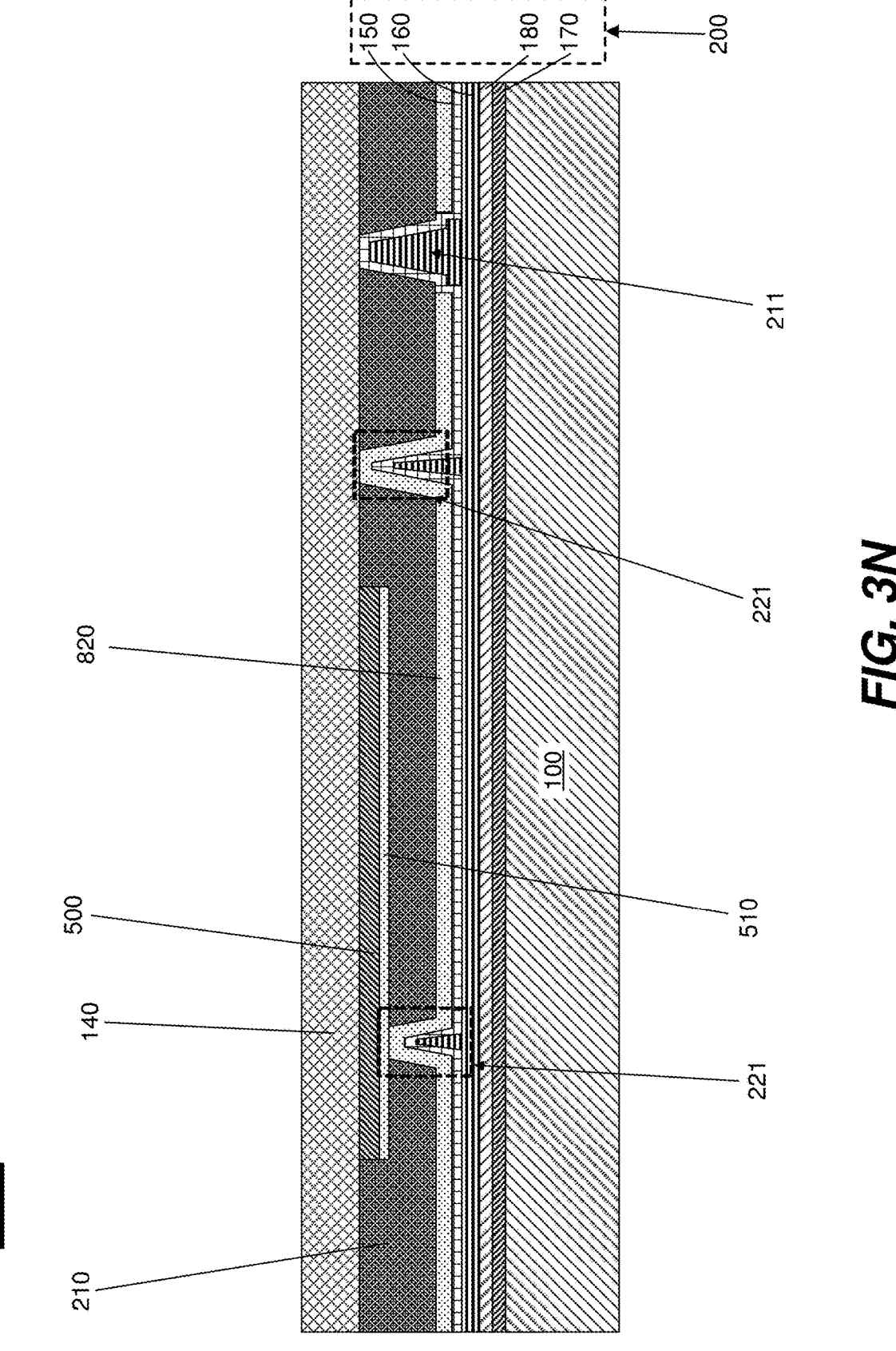
Figure 30:
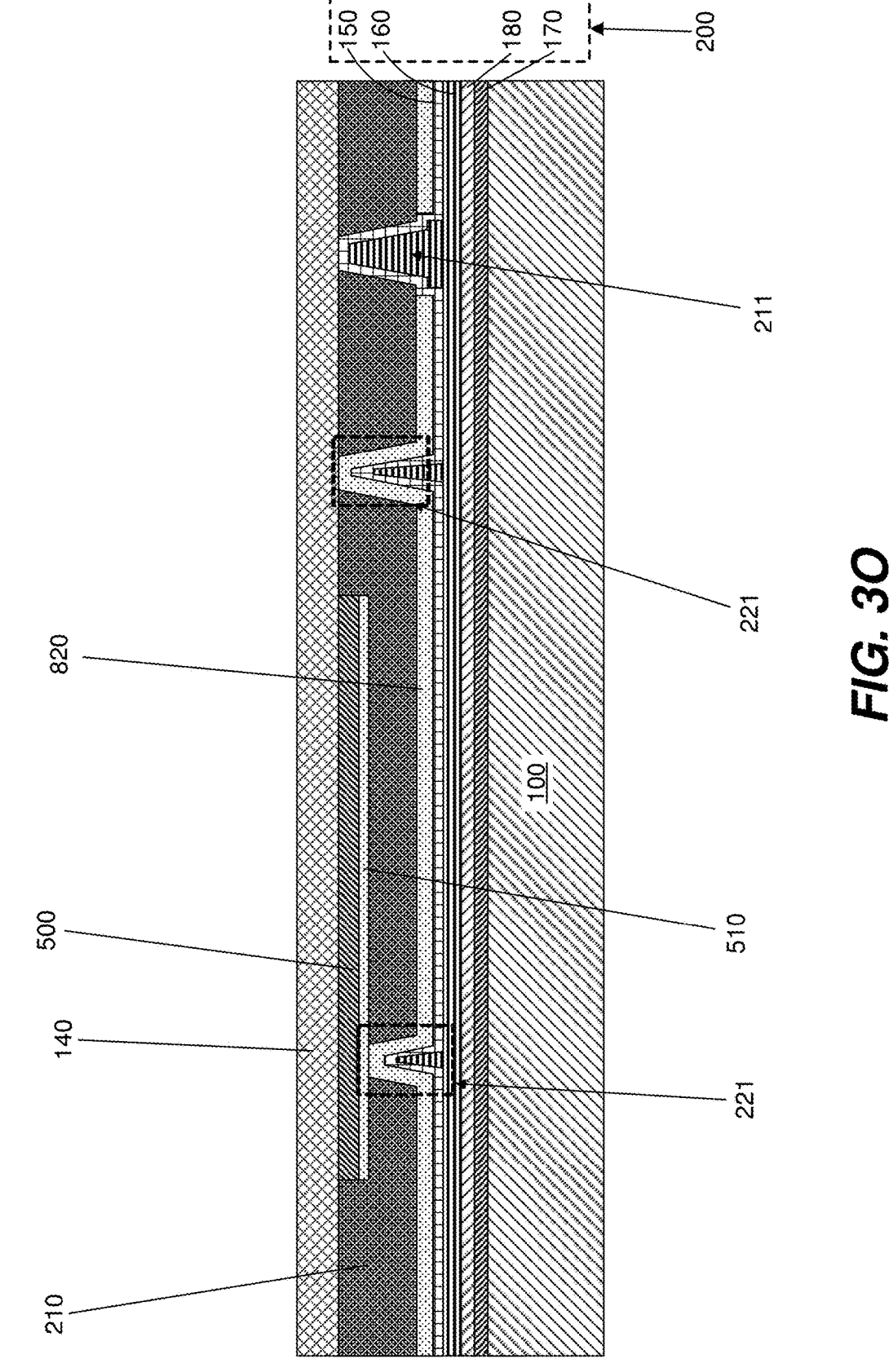

As illustrated in FIG. 3N, in step S13, buffer layer 3100 is removed to expose a surface layer of piezoelectric layer 140.

As illustrated in FIG. 3O, in step S14, a dry etching or an ion beam etching (IBE) process is performed to remove a portion of the exposed surface layer of piezoelectric layer 140. As a result, the thickness of piezoelectric layer 140 may be accurately controlled to be equal to the target thickness required for BAW resonator 10. The removed portion of piezoelectric layer 140 is the initially deposited portion of piezoelectric layer 140, the quality of which is relatively low and the piezoelectric performance of which is relatively poor. Thus, the removal of the initially deposited portion of piezoelectric layer 140 improves the performance of BAW resonator 10.

Figure 3P:
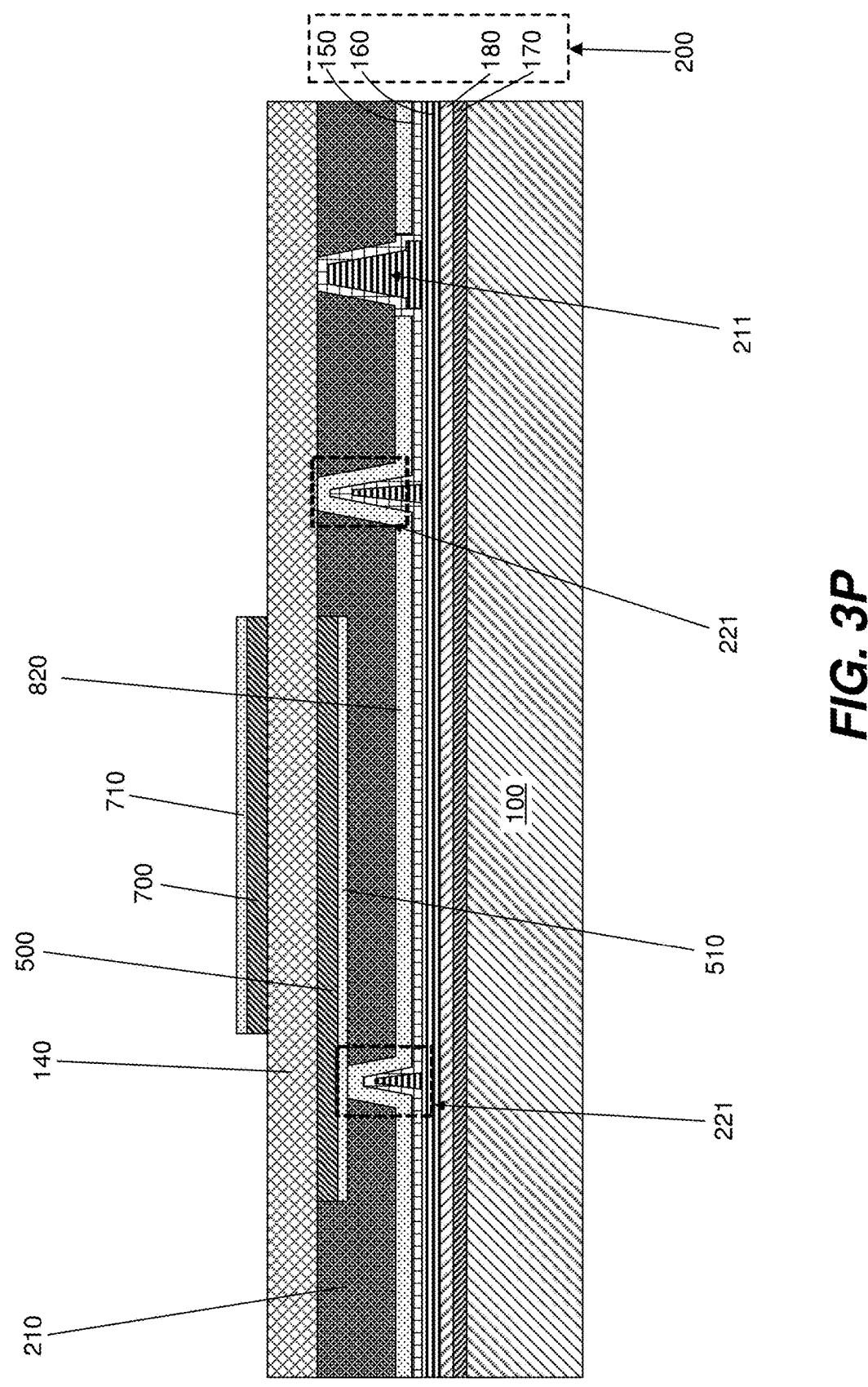

As illustrated in FIG. 3P, in step S15, a second electrode layer and a passivation layer are formed on piezoelectric layer 140. The second electrode layer and the passivation layer are patterned to form second electrode 700 and second passivation layer 710. Second electrode 700 and second passivation layer 710 partially overlap first electrode 500. The overlapping portions of first electrode 500 and second electrode 700 are surrounded by double-wall protruding structure 221. That is, the overlapping portions of first electrode 500 and second electrode 700 are aligned with cavity 1000 to be formed in a subsequent process.

Figure 3Q:
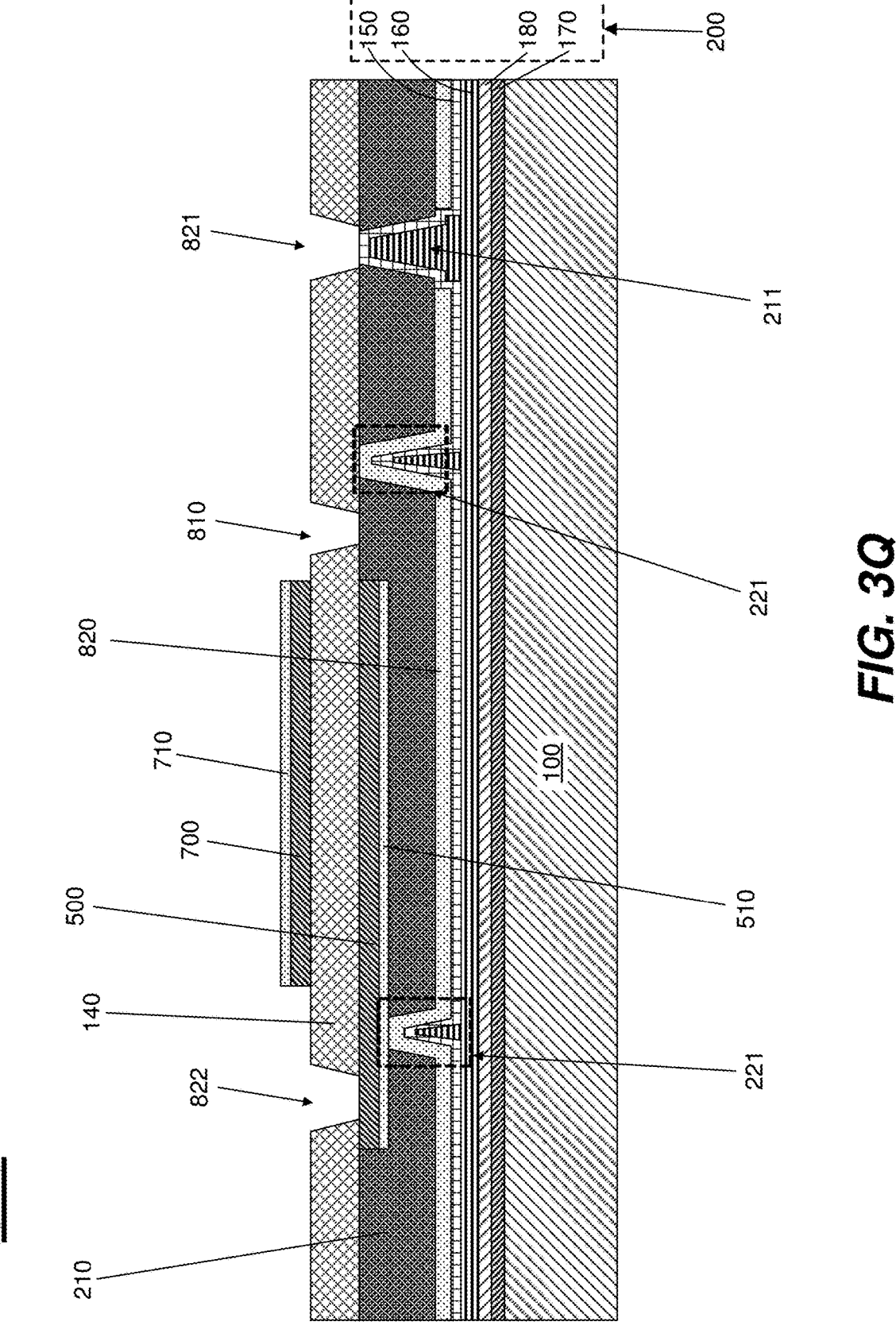

As illustrated in FIG. 3Q, in step S16, piezoelectric layer 140 is etched to form one or more release holes 810, second grounded through hole 821, and contact hole 822. Release holes 810 expose the portion of first dielectric layer 210 surrounded by double-wall protruding structure 221 (i.e., the sacrificial island for forming cavity 1000). Second grounded through hole 821 exposes a portion of first adhesive layer 150 of metal bonding layer 200 formed at the bottom of first grounded through hole 211. Contact hole 822 exposes a portion of first electrode 500.

Figure 3R:
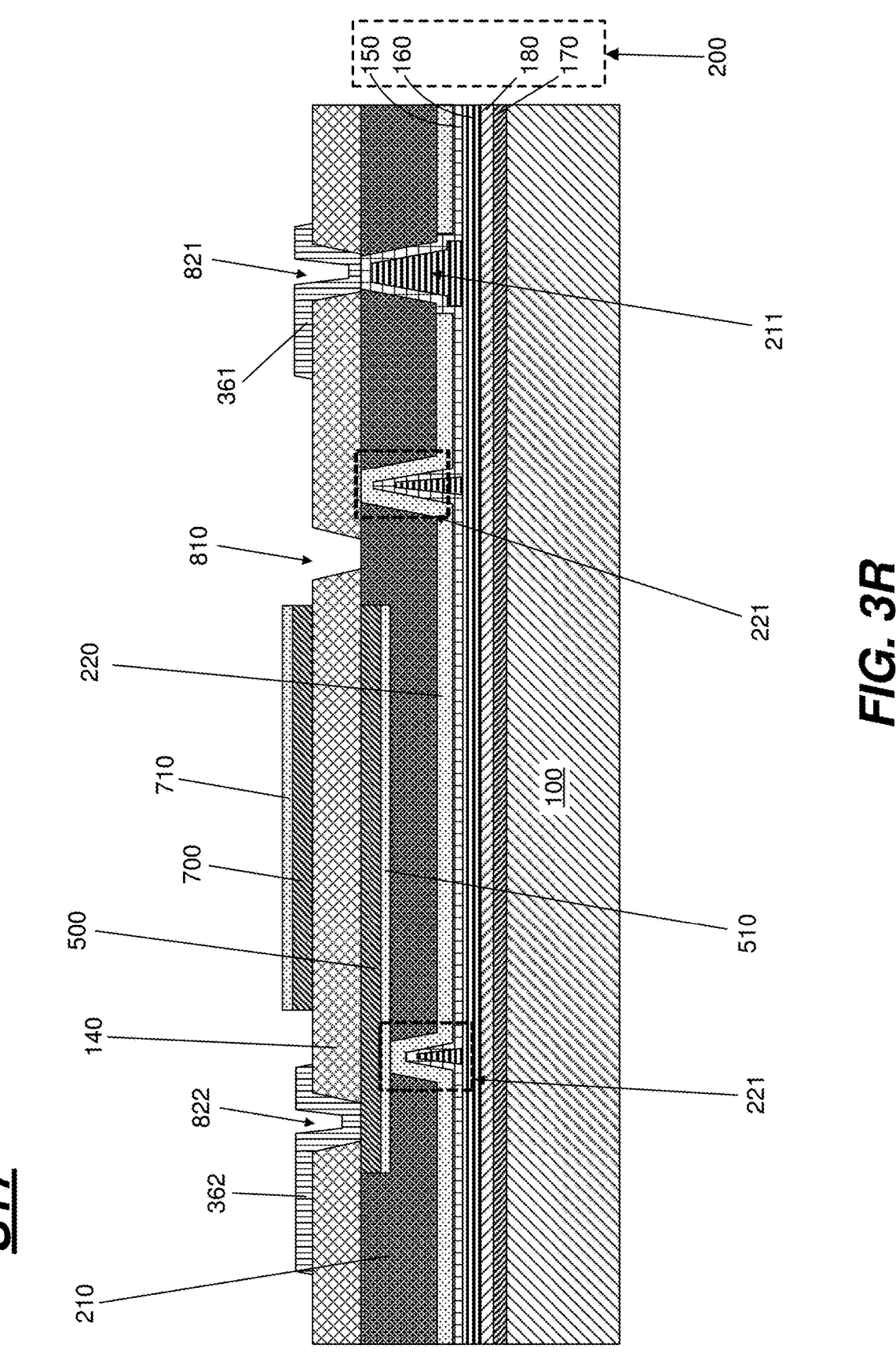
Figure 3S:
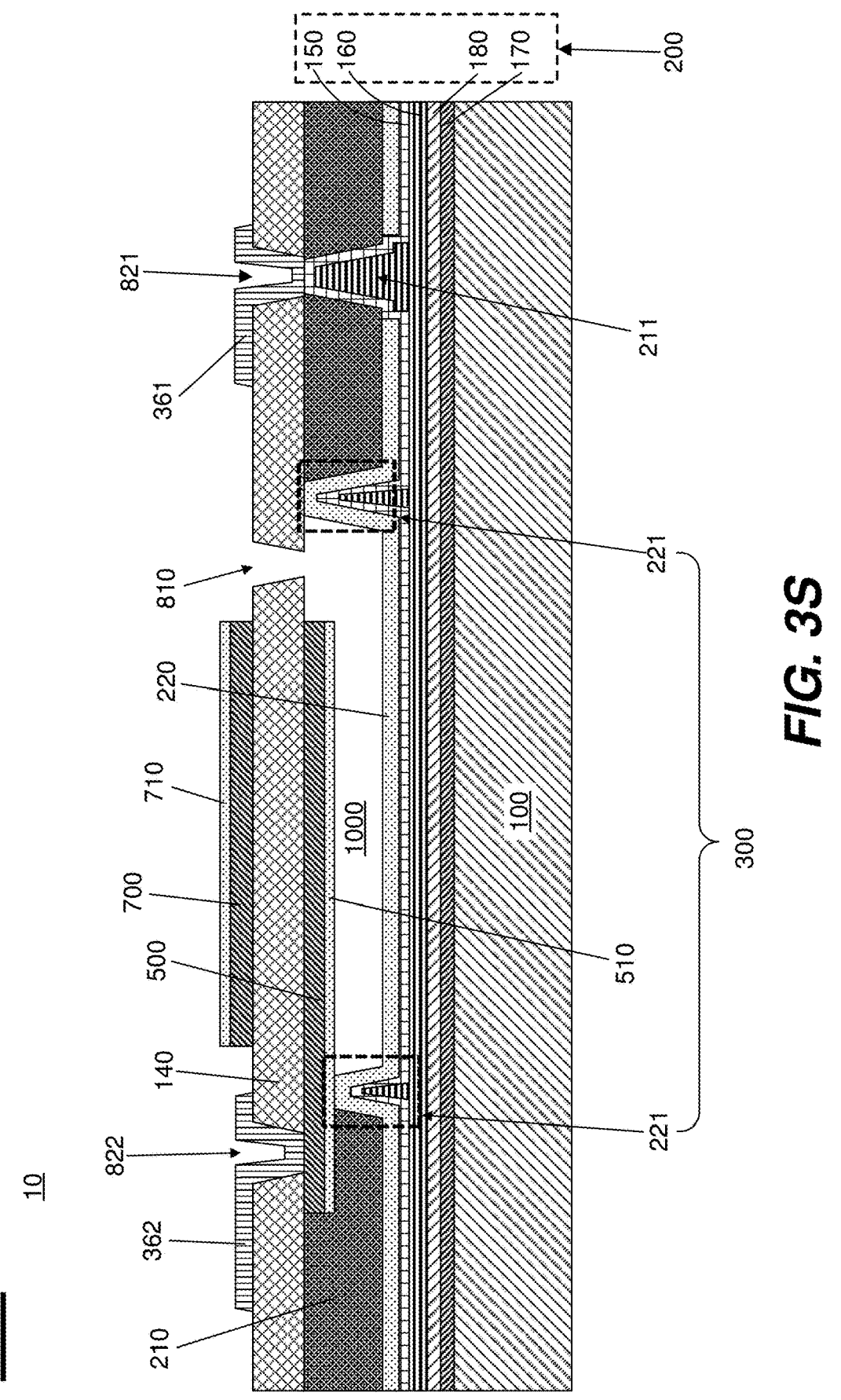

As illustrated in FIG. 3R, in step S17, a pad metal layer is formed on the structure of FIG. 3Q, and the pad metal layer is patterned to form ground pad metal layer 361 and first electrode pad metal layer 362. Ground pad metal layer 361 is disposed on piezoelectric layer 140 and in second grounded through hole 821. The portion of ground pad metal layer 361 disposed in second grounded through hole 821 contacts the portion of first adhesive layer 150 of metal bonding layer 200 disposed in first grounded through hole 211. Accordingly, ground pad metal layer 361 electrically connects metal bonding layer 200 to ground. First electrode pad metal layer 362 is disposed on piezoelectric layer 140 and in contact hole 822. The portion of first electrode pad metal layer 362 disposed in contact hole 822 contacts and electrically connects to first electrode 500. First electrode pad metal layer 362 is used for external electrical connection of BAW resonator 10.

As illustrated in FIG. 3S, in step S18, the portion of first dielectric layer 210 surrounded by double-wall protruding structure 221 is etched and removed to form cavity 1000. The etchant and etching product formed during the etching process is released via the one or more release holes 810. Thus, BAW resonator 10 illustrated in FIGS. 1A and 1B is fabricated.

Other embodiments of the disclosure will be apparent to those skilled in the art from consideration of the specification and practice of the disclosure disclosed herein. It is intended that the specification and examples be considered as exemplary only, with a true scope and spirit of the invention being indicated by the following claims.

What is claimed is:
1. A bulk acoustic wave (BAW) resonator, comprising:
   a substrate;
   a piezoelectric layer disposed above the substrate;
   a first electrode disposed below the piezoelectric layer;
   a second electrode disposed above the piezoelectric layer;
   a first dielectric layer disposed below the piezoelectric layer;
   a second dielectric layer disposed below the first dielectric layer;
   a cavity disposed below the first electrode;

a first grounded through hole disposed in the first dielectric layer and the second dielectric layer and spaced away from the cavity;

a metal bonding layer disposed between the second dielectric layer and the substrate, with a portion of the metal bonding layer being disposed in the first grounded through hole;

a second grounded through hole disposed in the piezoelectric layer and aligned with the first grounded through hole; and a ground pad metal layer disposed on the piezoelectric layer, with a portion of the ground pad metal layer being disposed in the second grounded through hole, wherein the portion of the ground pad metal layer in the second grounded through hole is electrically connected to the portion of the metal bonding layer in the first grounded through hole.

2. The BAW resonator of claim 1, wherein:

the metal bonding layer includes a first adhesive layer, a first bonding layer, a second adhesive layer, and a second bonding layer, and the second bonding layer bonds to the first bonding layer by eutectic bonding or metal diffusion bonding.

3. The BAW resonator of claim 2, wherein the first adhesive layer and the second adhesive layer are formed of one of chromium (Cr), titanium (Ti), titanium nitride (TiN), titanium tungsten (TiW), tantalum (Ta), tantalum nitride (TaN), or a stacked combination of two or more of those materials.

4. The BAW resonator of claim 2, wherein the first bonding layer and the second bonding layer are formed of one of gold (Au), copper (Cu), aluminum (Al), indium (In), nickel (Ni), tin (Sn), or a stacked combination of two or more of those materials.

5. The BAW resonator of claim 2, wherein:

the first adhesive layer covers sidewalls and a bottom of the first grounded through hole, the first bonding layer overlays the first adhesive layer and fills in the first grounded through hole, the second adhesive layer is disposed on a surface of the substrate facing the piezoelectric layer, and the second bonding layer is disposed on the second adhesive layer and bonds to the first bonding layer by eutectic bonding or metal diffusion bonding.

6. The BAW resonator of claim 2, wherein:

the second dielectric layer includes a double-wall protruding structure protruding through the first dielectric layer toward the piezoelectric layer and surrounding the cavity, the first adhesive layer covers sidewalls and a bottom of the double-wall protruding structure, and the first bonding layer fills in the double-wall protruding structure.

7. The BAW resonator of claim 6, wherein the double-wall protruding structure contacts a portion of the piezoelectric layer and a portion of the first electrode.

8. The BAW resonator of claim 1, wherein the first dielectric layer is formed of silicon oxide.

9. The BAW resonator of claim 1, wherein the second dielectric layer is formed of polysilicon, amorphous silicon, silicon nitride, aluminum nitride, gallium nitride, tantalum nitride, or a stacked combination of two or more of those materials.

10. The BAW resonator of claim 1, further comprising:

one or more release holes formed in the piezoelectric layer, and exposing the cavity.

11. The BAW resonator of claim 1, further comprising:

a contact hole in the piezoelectric layer, and exposing a portion of the first electrode; and a first electrode pad metal layer disposed on the piezoelectric layer and in the contact hole, and contacts the first electrode.

\* \* \* \* \*